(12) United States Patent
Chen et al.

(10) Patent No.: US 9,119,461 B2
(45) Date of Patent: Sep. 1, 2015

(54) HIGH STIFFNESS, ANTI-SLIP SCRUBBER BRUSH ASSEMBLY, HIGH-STIFFNESS MANDREL, SUBASSEMBLIES, AND ASSEMBLY METHODS

(75) Inventors: Hui Chen, Burlingame, CA (US); Hung Chen, Sunnyvale, CA (US); Jim Atkinson, Los Gatos, CA (US); David D. Huo, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 13/456,796

(22) Filed: Apr. 26, 2012

(65) Prior Publication Data

US 2013/0283556 A1    Oct. 31, 2013

(51) Int. Cl.
| | |
|---|---|
| B08B 1/04 | (2006.01) |
| A46B 3/00 | (2006.01) |
| A46B 13/00 | (2006.01) |
| H01L 21/02 | (2006.01) |

(52) U.S. Cl.
CPC ............. A46B 3/005 (2013.01); A46B 13/001 (2013.01); H01L 21/02096 (2013.01)

(58) Field of Classification Search
CPC .................................................. H01L 21/67046
USPC ................................. 15/230, 230.16–230.19
See application file for complete search history.

(56) References Cited

U.S. PATENT DOCUMENTS

| | | | |
|---|---|---|---|
| 6,299,698 B1 | 10/2001 | Emami et al. | |
| 6,728,989 B2 | 5/2004 | Lerner et al. | |
| 6,904,637 B2 | 6/2005 | Sugarman | |
| 7,063,749 B2 | 6/2006 | Sugarman | |
| 7,779,527 B2 | 8/2010 | Yudovsky et al. | |
| 8,372,210 B2 | 2/2013 | Sin et al. | |
| 2005/0109371 A1 | 5/2005 | Sin et al. | |
| 2005/0172438 A1 | 8/2005 | Yudovsky et al. | |
| 2007/0209135 A1 | 9/2007 | Chen et al. | |
| 2008/0011325 A1 | 1/2008 | Olgado et al. | |
| 2008/0141475 A1 | 6/2008 | Drury | |
| 2013/0139851 A1 | 6/2013 | Sin et al. | |

FOREIGN PATENT DOCUMENTS

| | | |
|---|---|---|
| JP | 2007-289878 | 11/2007 |
| KR | 10-2011-0034802 | 4/2011 |
| WO | WO 2011-146672 A2 | 11/2011 |

OTHER PUBLICATIONS

International Search Report and Written Opinion of International Application No. PCT/US2013/035681 mailed Jun. 28, 2013.

(Continued)

*Primary Examiner* — Laura C Guidotti (74) *Attorney, Agent, or Firm* — Dugan & Dugan, PC (57) ABSTRACT

In one aspect, a scrubber brush assembly is provided. The scrubber brush assembly includes a scrubber brush having a body of open-cell foam including an interior surface, a sleeve received in contact with the scrubber brush, the sleeve including peripherally-spaced, longitudinal walls and reinforcing segments interconnecting adjacent ones of the longitudinal walls and forming elongated pockets along the length, the sleeve having raised ribs extending along the length, and a mandrel having recesses formed on an outer surface, the mandrel being coupled to the sleeve by receiving the raised ribs within the recesses. Scrubber brush subassemblies, high stiffness mandrels, and methods of assembly are provided, as are numerous other aspects.

12 Claims, 10 Drawing Sheets

(56) References Cited

OTHER PUBLICATIONS

Chen et al., U.S. Appl. No. 13/456,779, filed Apr. 26, 2012.
Office Action of U.S. Appl. No. 13/456,779, mailed Apr. 3, 2014.
International Search Report and Written Opinion of International Application No. PCT/US2013/035682 mailed Jul. 29, 2013.
International Preliminary Report on Patentability and Written Opinion of International Application No. PCT/US2013/035681 mailed Nov. 6, 2014.
International Preliminary Report on Patentability and Written Opinion of International Application No. PCT/US2013/035682 mailed Nov. 6, 2014.
Notice of Abandonment of U.S. Appl. No. 13/456,779, mailed Dec. 12, 2014.

HIGH STIFFNESS, ANTI-SLIP SCRUBBER BRUSH ASSEMBLY, HIGH-STIFFNESS MANDREL, SUBASSEMBLIES, AND ASSEMBLY METHODS

FIELD

The present invention relates generally to semiconductor device manufacturing, and more particularly to a scrubber brush and scrubber brush assembly adapted to clean a substrate.

BACKGROUND

A scrubber brush assembly, which includes a scrubber brush subassembly mounted on a mandrel, may be used for cleaning a substrate. For example, the scrubber brush assembly may be employed in a substrate processing system, such as in a substrate chemical and mechanical cleaning system, to clean and/or scrub a major surface of a substrate during substrate processing. Furthermore, the scrubber brush assembly may be used in other substrate processing systems.

To assemble a conventional scrubber brush assembly for use in a substrate processing system, the scrubber brush subassembly including a scrubber brush and sleeve is installed (e.g., slid) onto the mandrel. The scrubber brush subassembly may include a sleeve having raised ribs that are received in grooves formed on the mandrel. This raised rib/grove arrangement of the scrubber brush assembly is provided in an attempt to minimize slippage between the scrubber brush and the mandrel. Although such scrubber brush assemblies may be effective in some cleaning and/or scrubbing circumstances, they have been found to suffer from functional deficiencies under other circumstances. Thus, improved scrubber brush subassemblies and scrubber brush assemblies are desired.

SUMMARY

In a first aspect of the invention, a method of assembling a scrubber brush assembly is provided. The method includes providing a scrubber brush subassembly having a scrubber brush body of molded foam having an interior surface, and a sleeve having an exterior surface received in contact with the interior surface, the sleeve including a plurality of peripherally-spaced, longitudinal walls extending along a length of the sleeve, and reinforcing segments interconnecting adjacent ones of the peripherally-spaced, longitudinal walls provided along the length, the sleeve having a mounting passage with raised ribs, providing a mandrel having a mandrel body with recesses formed on an outer surface, and inserting the mandrel into the mounting passage and receiving the raised ribs within the recesses to form the scrubber brush assembly.

In another aspect of the invention, a scrubber brush assembly is provided. The scrubber brush assembly includes a scrubber brush having a scrubber brush body of open-cell foam including an interior surface, a sleeve having an exterior surface received in contact with the interior surface, the sleeve including peripherally-spaced, longitudinal walls extending along a length of the sleeve, and reinforcing segments provided along the length of the sleeve interconnecting adjacent ones of the peripherally-spaced, longitudinal walls and forming elongated pockets, the sleeve having raised ribs extending along the length, and a mandrel having recesses formed on an outer surface of the mandrel, the mandrel being coupled to the raised ribs by receiving the raised ribs within the recesses.

In another aspect, a scrubber brush subassembly is provided. The scrubber brush subassembly includes a scrubber brush body of molded open-cell foam having an interior surface, and a sleeve having an exterior surface received in contact with the interior surface, the sleeve including a plurality of peripherally-spaced, longitudinal walls extending along a length of the sleeve, and reinforcing segments provided along the length and interconnecting adjacent ones of the peripherally-spaced, longitudinal walls to form elongated pockets, the sleeve including a mounting passage having raised ribs extending along the length.

In another aspect, a scrubber brush mandrel is provided. The scrubber brush mandrel includes a mandrel body having a central axis and recesses formed on an outer surface of the mandrel, the recesses extending longitudinally and configured and adapted to receive raised ribs of a scrubber brush subassembly, and at least one stiffening member received in the mandrel body and offset from the central axis.

Other features and aspects of the present invention will become more fully apparent from the following detailed description of exemplary embodiments, the appended claims, and the accompanying drawings.

DETAILED DESCRIPTION

A scrubber brush assembly is provided that includes a inner surface receiving a sleeve having raised ribs adapted to couple (e.g., lock) into recesses (e.g., groves) of a mandrel. The mandrel is received into the sleeve and interfaces with the raised ribs so as to form a scrubber brush assembly that may be used for cleaning a substrate and minimize relative rotation (e.g., rotational slippage) there between. For example, the scrubber brush assembly may be employed in a substrate processing system, such as a substrate cleaning system, to scrub and/or clean a major surface of a substrate during substrate processing. Further, the scrubber brush assembly may be used in other substrate processing systems.

Certain prior art scrubber brushes have included a smooth cylindrical inner surface having a sleeve received therein. Generally, because no adhesive may be allowed to be used because such chemicals in the adhesive might contaminate the liquid used in the scrubbing/cleaning operation, mechanical locking between the scrubber brush and the sleeve have been utilized to restrain relative rotation there between. However, it was discovered by the inventors that when convention systems are used in cleaning operations on relatively large substrates, this smooth surface may have a propensity to rotate on the mandrel due to increased friction forces between the brush and the relatively larger substrate surface being scrubbed by the scrubber brush. This is especially true when substrates larger than 300 mm are being processed, such as those of 450 mm or above. Moreover, the length of the mandrel being increased to accommodate longer scrubber brushes also causes bending problems which exacerbates sleeve slippage against the scrubber brush.

In order to overcome one or more problems of the prior art assemblies, apparatus and assembly embodiments of the invention provide increased mechanical engagement between the mandrel and the scrubber brush. In particular, in one aspect, a scrubber brush subassembly includes improved sleeve bending stiffness and mechanical engagement between the sleeve and scrubber brush by providing the sleeve having an exterior surface received in contact with the interior surface of the scrubber brush, wherein the sleeve includes a plurality of peripherally-spaced, longitudinal walls extending along a length of the sleeve, and reinforcing segments provided along the length and interconnecting adjacent ones of the longitudinal walls to form elongated pockets. The reinforcing segments may be in the form of hoops arranged along the length of the sleeve, and may increase the bending stiffness of the sleeve by about a factor of about 30% or more. Frictional engagement between the interior foam surface of the scrubber brush and the sleeve is improved by the provision of the elongated pockets, as well as by the addition of friction-enhancing apertures formed along the length of the plurality of peripherally-spaced, longitudinal walls.

In another aspect, a stiffness of the scrubber brush mandrel adapted to be received in the scrubber brush subassembly is dramatically stiffened. Accordingly, mandrel bending is use may be minimized, especially when large substrates of 450 mm or greater are being scrubbed and/or cleaned. The mandrel stiffness is increased by providing a mandrel body having at least one stiffening member offset from a central axis received in the mandrel body. In one or more embodiments, the mandrel comprises a plurality of stiffening members offset from and arranged around the central axis, such as circular rods received in pockets formed in the mandrel body. To further improve bending stiffness, the mandrel body may comprise a polyetheretherketone (PEEK) material.

Accordingly, the scrubber brush may be mechanically locked in place relative to the sleeve (e.g., so as to prevent the scrubber brush from rotating relative to the sleeve) even when large substrates are scrubbed and/or cleaned. Further, bending of the mandrel, the scrubber brush subassembly, and the scrubber brush assembly may be minimized. Accordingly, longer scrubber brushes may be used to process the larger substrates. These and other aspects of embodiments of the invention are described below with reference to FIGS. 1-7 herein.

Figure 1A:
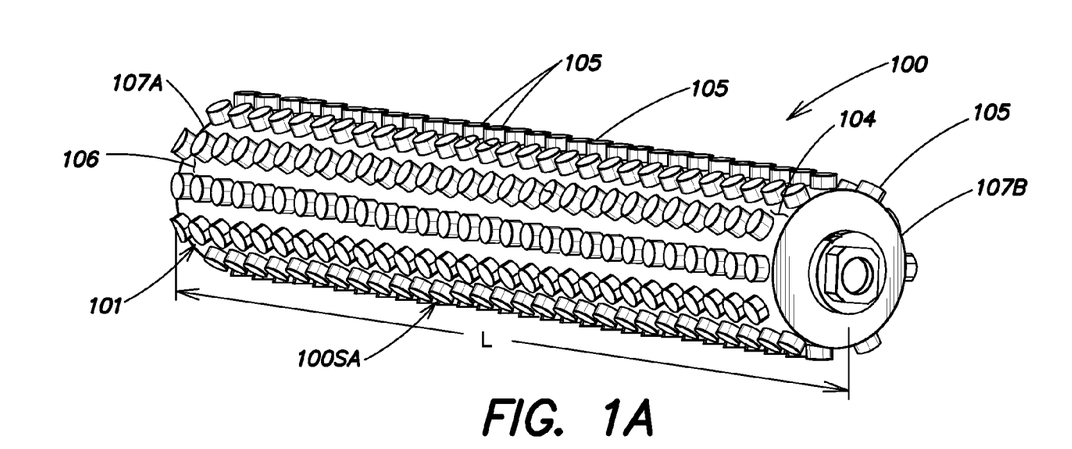
FIG. 1A illustrates an isometric view of a scrubber brush assembly according to embodiments.
Figure 1B:
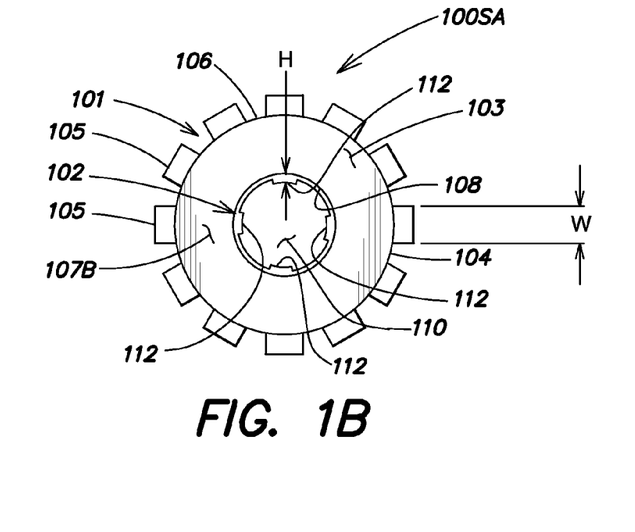
FIG. 1B illustrates an end plan view of a scrubber brush subassembly according to embodiments.
Figure 2A:
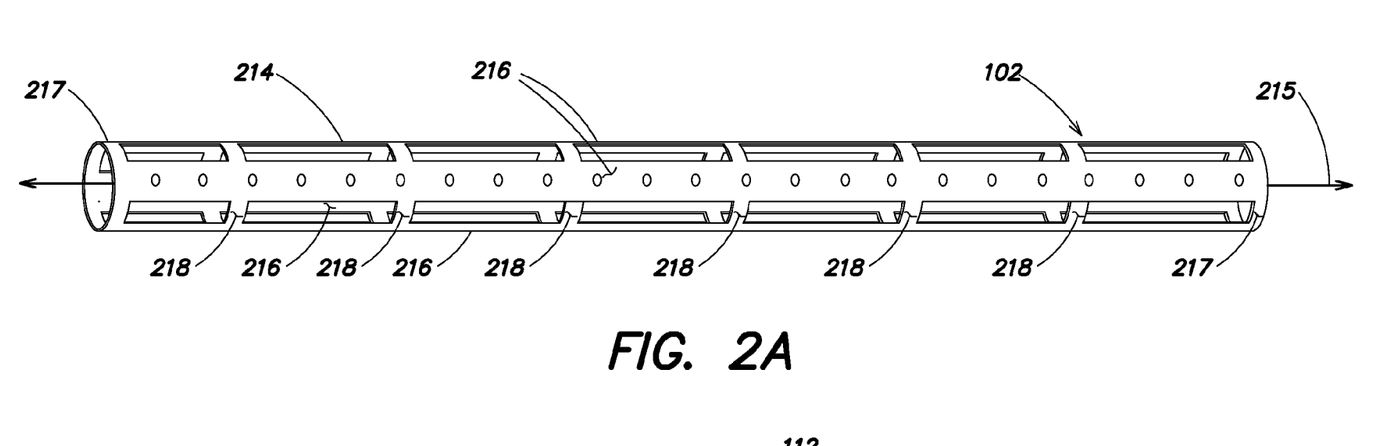
FIG. 2A illustrates an isometric view of a stiffened scrubber brush sleeve according to embodiments.
Figure 2B:
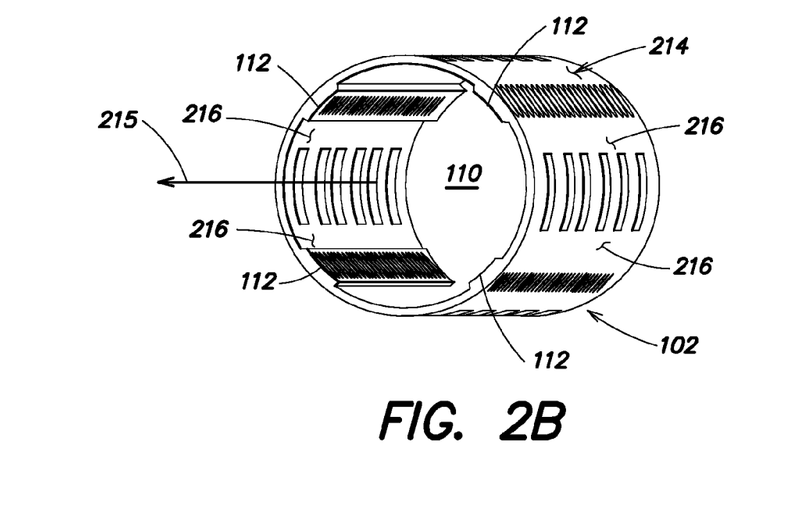
FIG. 2B illustrates an isometric end view of a scrubber brush sleeve showing the raised ribs extending along a length of the sleeve according to embodiments.
Figure 2C:
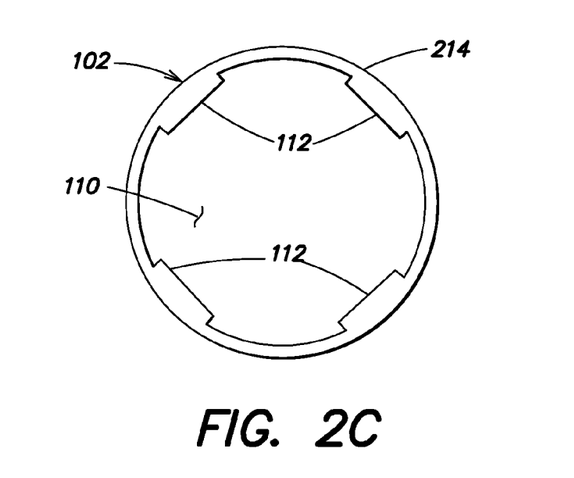
FIG. 2C illustrates an end view of a scrubber brush sleeve showing the raised ribs according to embodiments.
Figure 2D:
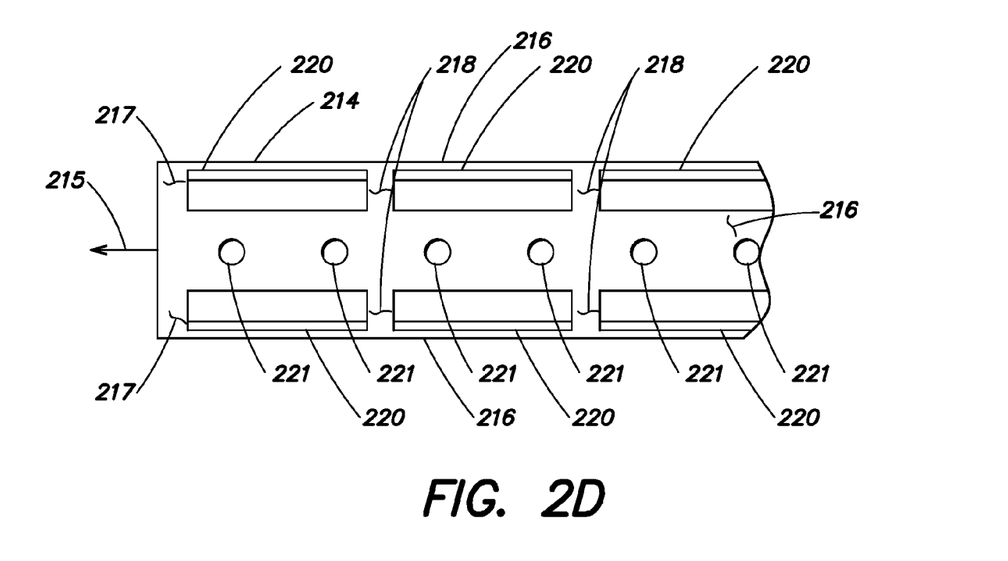
FIG. 2D illustrates a partial enlarged side view of a scrubber brush sleeve showing the elongated pockets and friction-enhancing apertures according to embodiments.
Figures 3A, 3B:
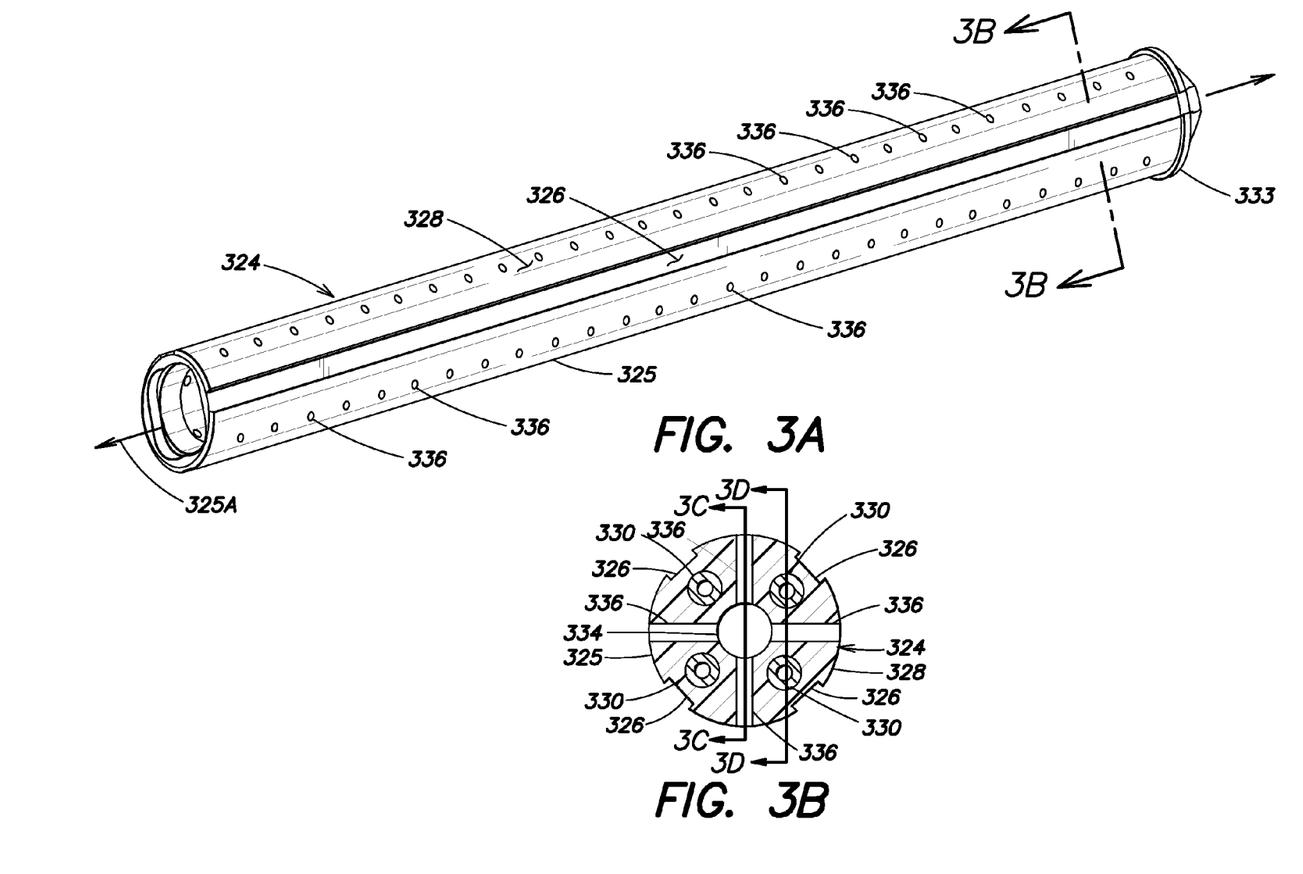
FIG. 3A illustrates an isometric view of a mandrel according to embodiments.
FIG. 3B illustrates an enlarged cross-sectioned view of a mandrel taken along section lines 3B-3B of FIG. 3A according to embodiments.

FIGS. 1A and 1B illustrate an isometric view of a scrubber brush assembly 100 (FIG. 1A) and end view of a scrubber brush subassembly 100SA (FIG. 1B). The scrubber brush assembly 100 comprises the scrubber brush subassembly 100SA mounted to a mandrel 324 (FIG. 3A). The scrubber brush subassembly 100SA includes a scrubber brush 101 and a sleeve 102 (FIG. 1B). The sleeve 102 is received in the scrubber brush 101 and the mandrel 324 (FIG. 3A-3B) is received in the sleeve 102 in accordance with one or more embodiments of the present invention. The scrubber brush 101 may be generally cylindrical in shape and have a scrubber brush body 103 with an exterior surface 104 that may be profiled. The profiled exterior surface 102 may include numerous molded exterior surface features 105, such as cylindrical nodules that project radially from a cylindrical surface 106 of the scrubber brush body 103. The molded exterior surface features 105 may be provided substantially along an entire length L of the scrubber brush 101 from a first end 107A to a second end 107B thereof. The molded exterior surface features 105 may be provided in any suitable pattern, such as in staggered rows, wherein the nodules of adjacent rows may be offset lengthwise from one another in adjacent rows. Other exterior surface shapes, nodule shapes, and/or nodule patterns may be used. Alternatively, in other embodiments, the exterior surface 104 of the scrubber brush 101 may include a smooth geometry and may be devoid of such nodules.

The entire scrubber brush body 103 of the scrubber brush 101 may, for example, be made of a resilient and porous foam material that may have sponge-like properties. For example, the foam material may comprise an open-cell foam, such as an open-cell polyurethane foam material. Other and/or different open-cell foam materials may be used, such as polyvinyl acetate (PVA), or polypropylene.

The scrubber brush 101 may include an interior surface 108, such as a cylindrical interior surface, into which the sleeve 102 is received. In one or more embodiments of the invention, the sleeve 102 may comprise one or more raised ribs 112 that are configured and adapted to directly couple into and be received within recesses 326 formed in an outer surface of a mandrel 324 (FIGS. 3A-3B). In the depicted embodiment, a plurality of raised ribs 112 are shown. However, two or more, three or more, four or more, or even five or more raised ribs 112 may be used. Other numbers of raised ribs may be used.

As shown in FIG. 1B, the raised ribs 112 may have a height H, as measured from the outer surface of the sleeve 102 to the innermost surface of the raised rib 112, of greater than about 1 mm, and between about 1 mm and about 2 mm in some embodiments. A width W of the raised ribs 112 may be greater than about 4 mm, and may be between about 4 mm and about 5.5 mm in some embodiments. Other height H and width W dimensions may be used. The raised ribs 112 may include three sides such as shown in FIG. 1B. At least some portion of the three sides may be received within the recesses 326 of the mandrel 324 (FIG. 3A-3B). Other suitable shapes for the raised ribs 112 may be used. For example, the sides may be tapered or sloped.

The sleeve 102 and the raised ribs 112 may be manufactured from a suitably rigid material. For example, the sleeve 102 and the raised ribs 112 thereof may comprise a polyetheretherketone (PEEK) material. Other suitably rigid materials may be used. The sleeve 102 forms a mounting passage 110 into which the mandrel 324 (FIGS. 3A-3B) may be received.

In particular, the scrubber brush 101 including the interior surface 108 may receive the sleeve 102 therein by sliding and/or use of a funnel tool. Optionally, the sleeve 102 may be provided in a mold, and the scrubber brush 101 may be formed (pre-molded) onto the sleeve 102. Upon being received therein, the scrubber brush body 103 of the molded foam becomes mechanically locked to the exterior surface 214 (FIG. 2A-2D) of the sleeve 102, such that rotation is avoided or minimized as will be apparent from the following. In both instances, the mandrel 324 is coupled to the scrubber brush subassembly 100SA by directly coupling (e.g., receiving) the raised ribs 112 within the recesses 322 formed in the mandrel 324.

In accordance with an aspect of embodiments of the invention, the configuration of the sleeve 102 has been improved to provide a relatively high stiffness in bending. In particular, the sleeve 102, as shown in FIGS. 2A-2D, includes an exterior surface 214 that may be cylindrical and is received in contact with the interior surface 108 of the scrubber brush 101 comprising foam (e.g., open-cell foam). The sleeve 102 includes peripherally-spaced, longitudinal walls 216 arranged about a longitudinal axis 215 that extends along a physical center of the sleeve 102. The peripherally-spaced, longitudinal walls 216 extend along the longitudinal axis 215 and may comprise three or more, four or more, or five or more in number. Other numbers of walls 216 may be used.

In one or more embodiments, the longitudinal walls 216 may be evenly spaced about a radial periphery of the sleeve 102. Interconnecting adjacent ones of the peripherally-spaced, longitudinal walls 216 are end segments 217 located at or near the ends of the sleeve 102. Also interconnecting adjacent ones of the peripherally-spaced, longitudinal walls 216 are one or more reinforcing segments 218 located between the end segments 217. In the depicted embodiment, a plurality of reinforcing segments 218 are provided along the longitudinal length of the sleeve 102 and are provided in a manner so as to form hoops (i.e., arranged at the same longitudinal location along the sleeve 102). For example, one or more, two or more, three or more, four or more, or five or more reinforcing segments 218 may be provided. In the depicted embodiment, six reinforcing segments 218 are provided interconnecting adjacent ones of the peripherally-spaced, longitudinal walls 216 and forming six reinforcing hoops along the length of the sleeve 102. Other numbers and arrangements of reinforcing segments 218 may be used. The reinforcing segments 218 substantially increase a bending stiffness of the sleeve 102. Accordingly, a relatively longer scrubber brush 101 may be accommodated without appreciable deflection at the center thereof, such as when scrubbing large substrates (e.g., with diameters of 450 mm or more).

The reinforcing segments 218 interconnect adjacent ones of the peripherally-spaced, longitudinal walls 216 and also form elongated pockets 220 in the sleeve 102. Elongated pockets 220 may be generally rectangular in shape. In one or more embodiments, the elongated pockets 220 may have a length along the central axis 215 that is greater than a width thereof. The elongated pockets 220 function to engage the interior surface 108 of the scrubber brush 101. As such, the elongated pockets 220 function to restrain relative rotation as well as relative axial motion between the scrubber brush 101 and sleeve 102. As discussed above, the sleeve 102 also includes a mounting passage 110 with raised ribs 112 extending along the longitudinal length.

In the depicted embodiment of FIGS. 2A-2D, the raised ribs 112 extend longitudinally along substantially an entire length of the sleeve 102. In the depicted embodiment, the raised ribs 112 are oriented so they extend along an inside of the peripherally-spaced, longitudinal walls 216, and may be approximately centered thereon. However, other locations of the raised ribs 112 on the sleeve 102 may be used. The sleeve 102 may be approximately a same length as the scrubber brush 101. In order to further retain relative rotation between the sleeve 102 and scrubber brush 101, further friction enhancing features may be provided on an exterior surface 214 of the sleeve 102. For example, friction-enhancing apertures 221 may be formed in the peripherally-spaced, longitudinal walls 216. The friction-enhancing apertures 221 may be arranged in a row and generally evenly spaced along the length of the sleeve 102. The elongated pockets 220 and friction-enhancing apertures 221 operate to engage with the interior surface 108 of the scrubber brush 101.

Now referring to FIG. 3A-3D, a mandrel 324 of the scrubber brush assembly 100 (FIGS. 1, and 5A-5D) is described. The mandrel 324 as described herein exhibits increased bending stiffness, and thus may accommodate relatively longer scrubber brushes 101. The mandrel 324 may be inserted directly into the mounting passage 110 of the sleeve 102 and the raised ribs 112 of the sleeve 102 may be received within and directly couple to the plurality of recesses 326 that are formed in the mandrel 324 so as to form a scrubber brush assembly 100 having utility for use during substrate processing.

In more detail, the mandrel 324 includes a mandrel body 325 that may have a generally cylindrical shape. A central axis 325A extends along a center of the mandrel 324. The plurality of recesses 326 may comprise square bottom grooves and are formed on an outer surface 328 of the mandrel 324. The recesses 326 extend longitudinally, preferably along an entire length of the mandrel 324. The number of recesses 326 may equal the number of raised ribs 112 on the sleeve 102. The recesses 326 may have a shape that closely matches the shape of the raised ribs 112 on the sleeve 102, but may be slightly larger than the raised ribs 112 to allow ease of assembly of the scrubber brush subassembly 100SA onto the mandrel 324.

In the depicted embodiment, to provide enhanced bending stiffness, at least one stiffening member 330 is provided in the mandrel body 325. The stiffening members 330 may be offset from the central axis 325A and received in pockets 332 (FIG. 3D) formed in the mandrel body 325. The number of stiffening members 330 may include two, three, four or more. Preferably, the stiffening members 330 may be provided in an equally spaced orientation, and may be provided radially equidistant from the central axis 325A. Stiffening members 330 may comprise rods or hollow rods, as shown in FIG. 3D that may extend along a length of the mandrel and may be approximately parallel with the central axis 325. The stiffening members 330 may comprise a material having a relatively higher modulus of elasticity (e.g., stiffness) than the mandrel body 325. For example, the mandrel body 325 may comprise a polyetheretherketone (PEEK) material, whereas the stiffening members 330 may comprise a metal, such as steel or aluminum. Other rigid materials may be used for the mandrel body 325 and stiffening members 330. As shown in FIG. 3D, the stiffening members 330 may extend along substantially an entire length of the mandrel body 325 and may be of substantially equal length. The stiffening members 330 may be retained in the mandrel body 325 by having a slight interference fit with the pockets 332 and also be being captivated by the end spacer 333.

Figure 3C:
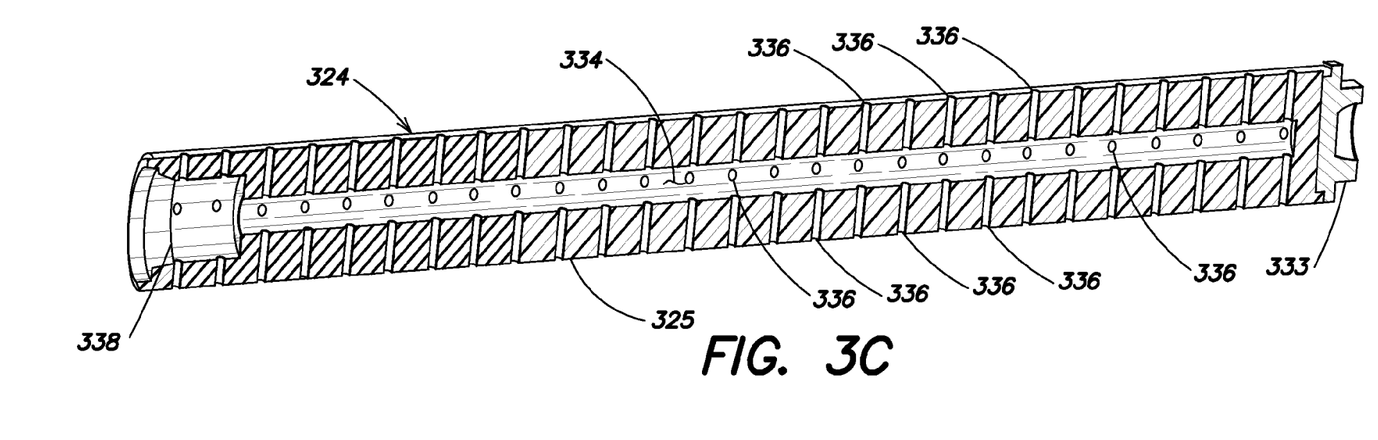
FIG. 3C illustrates a cross-sectioned side view of a mandrel taken along section lines 3C-3C of FIG. 3B according to embodiments.
Figure 3D:
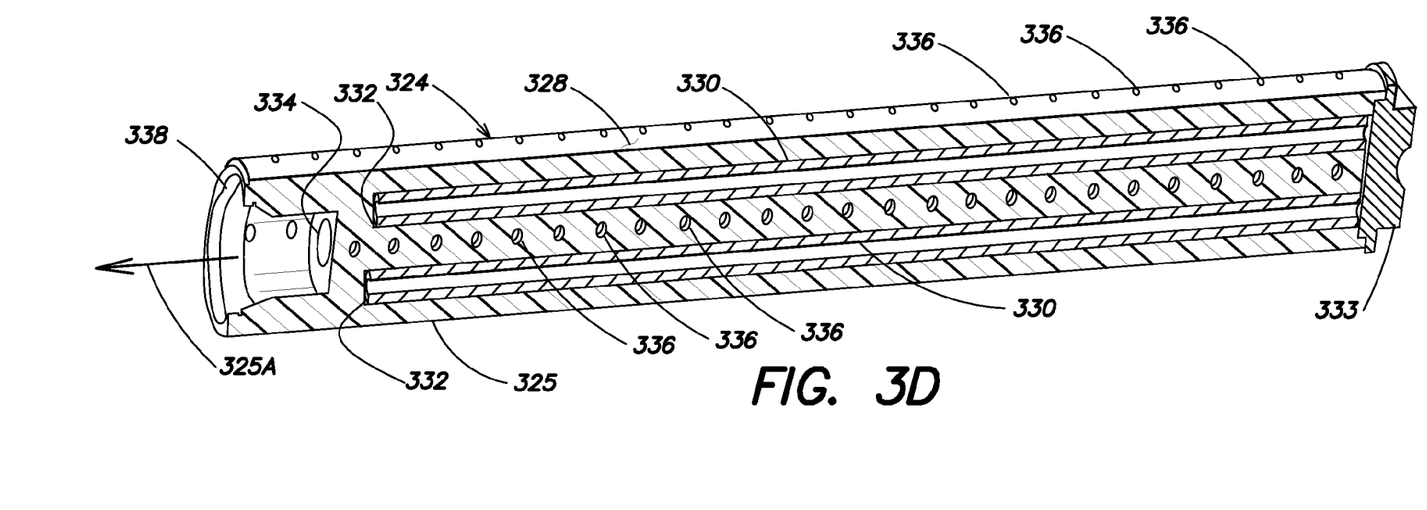
FIG. 3D illustrates a cross-sectioned side view of a mandrel taken along section lines 3D-3D of FIG. 3B according to embodiments.
Figure 4:
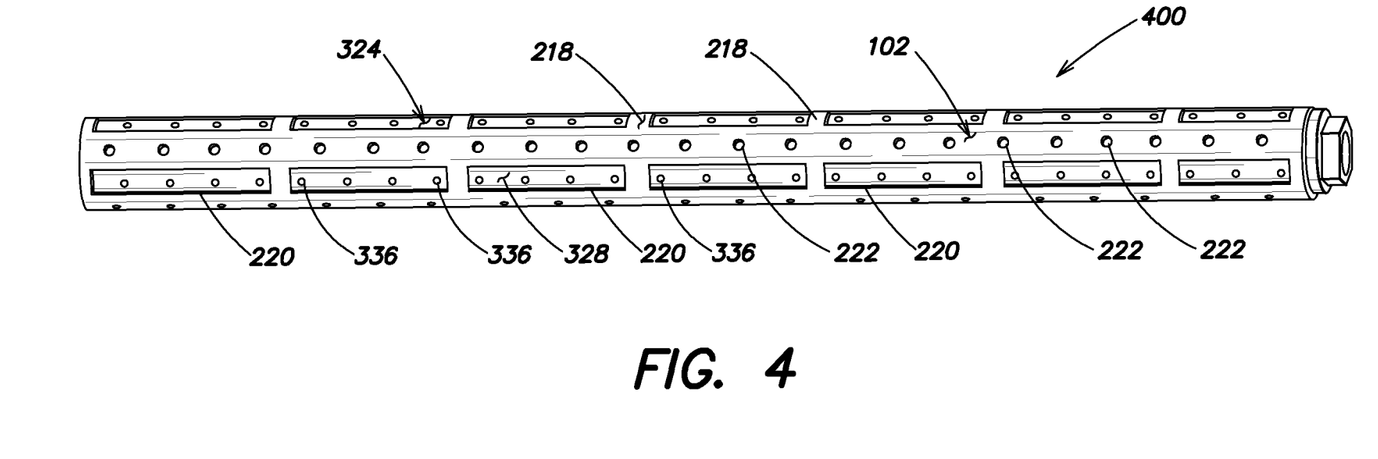
FIG. 4 illustrates an isometric view of an assembly of a mandrel having the sleeve received thereon according to embodiments.

As shown in FIGS. 3B, 3C and 3D, the mandrel 324 may include a central liquid passage 334 extending along a length of the mandrel body 325 and terminating in the mandrel body 325 at an end near the end spacer 333. Arranged along the length of the mandrel 324 are liquid feed ports 336 (only a few are labeled) which are fluidly interconnected connected to the central liquid passage 334 and operate as distribution channels to distribute a liquid used in the cleaning and/or scrubbing process to enter into the pores of the open-cell foam body of the scrubber brush 101. The liquid feed ports 336 extend from the central liquid passage 334 internal to the mandrel 324, between the stiffening members 330 as shown in FIGS. 3B and 3D, and to the outer surface 328 of the mandrel 324. The liquid feed ports 336 (e.g., holes) may be arranged in a row and may be generally evenly spaced along a length of the mandrel 324 as shown in FIGS. 3C and 3D and FIG. 4. Two or more, three or more, or even four or more liquid feed ports 336 may exit into each elongated pocket 220 of the sleeve 102. Other numbers and orientations of liquid feed ports 336 may be employed. The liquid feed ports 336 allow chemicals to be jetted directly into the foam structure (e.g., open-cell foam) of the scrubber brush 101 from the mandrel 324 inserted in the mounting passage 110 of the sleeve 102. Located at the end opposite the end spacer 333, is a coupling-receiving feature 338. The coupling-receiving feature 338 is adapted to receive a coupling 540 (FIG. 5A), as will be described below.

FIG. 4 illustrates an assembly 400 of the mandrel 324 with the sleeve 102, wherein the sleeve 102 is received over the outer surface 328 of the mandrel 324. In the depicted embodiment, the raised ribs 112 (FIG. 1B) are received in the recesses 326 (FIG. 3A), which functions to orient the elongated pockets 220 of the sleeve 102 with the liquid feed ports 336. Thus, the dispensed liquid may exit the liquid feed ports 336 and exit directly into the open-cell foam of the scrubber brush 101 (FIG. 1B) through the elongated pockets 220. Together, the combination of the sleeve 102 including the reinforcing segments 218 and the mandrel 324 with the reinforcing members 330 provides a substantially stiffer assembly 400, while still allows adequate liquid flow and generally uniform liquid distribution into the scrubber brush 101. Furthermore, the elongated pockets 220, and apertures 222 provide an excellent mechanical lock and operates to prevent or minimize the scrubber brush 101 from twisting and/or rotating (e.g., slipping) relative to the sleeve 102.

Referring now to FIGS. 5A-5D, various views of the scrubber brush assembly 100 and components thereof are shown. The scrubber brush assembly 100 includes the scrubber brush 101, and the sleeve 102 described above having a mounting passage 110 (FIG. 1B) that is received over a mandrel 324. In operation, the mandrel 324 may be driven and rotated, such as by the motor of a brush box or other tool, to cause the scrubber brush 101 to rotate relative to a substrate surface during a scrubbing operation. When the scrubber brush 101 needs to be replaced, the mandrel 324 may be easily removed from the scrubber brush subassembly 100SM (FIG. 1B) and a new scrubber brush subassembly 100SA may be inserted thereon to form a new scrubber brush assembly 100. The new scrubber brush assembly 100 then may be used for substrate processing as previously described.

Figures 5A, 5B:
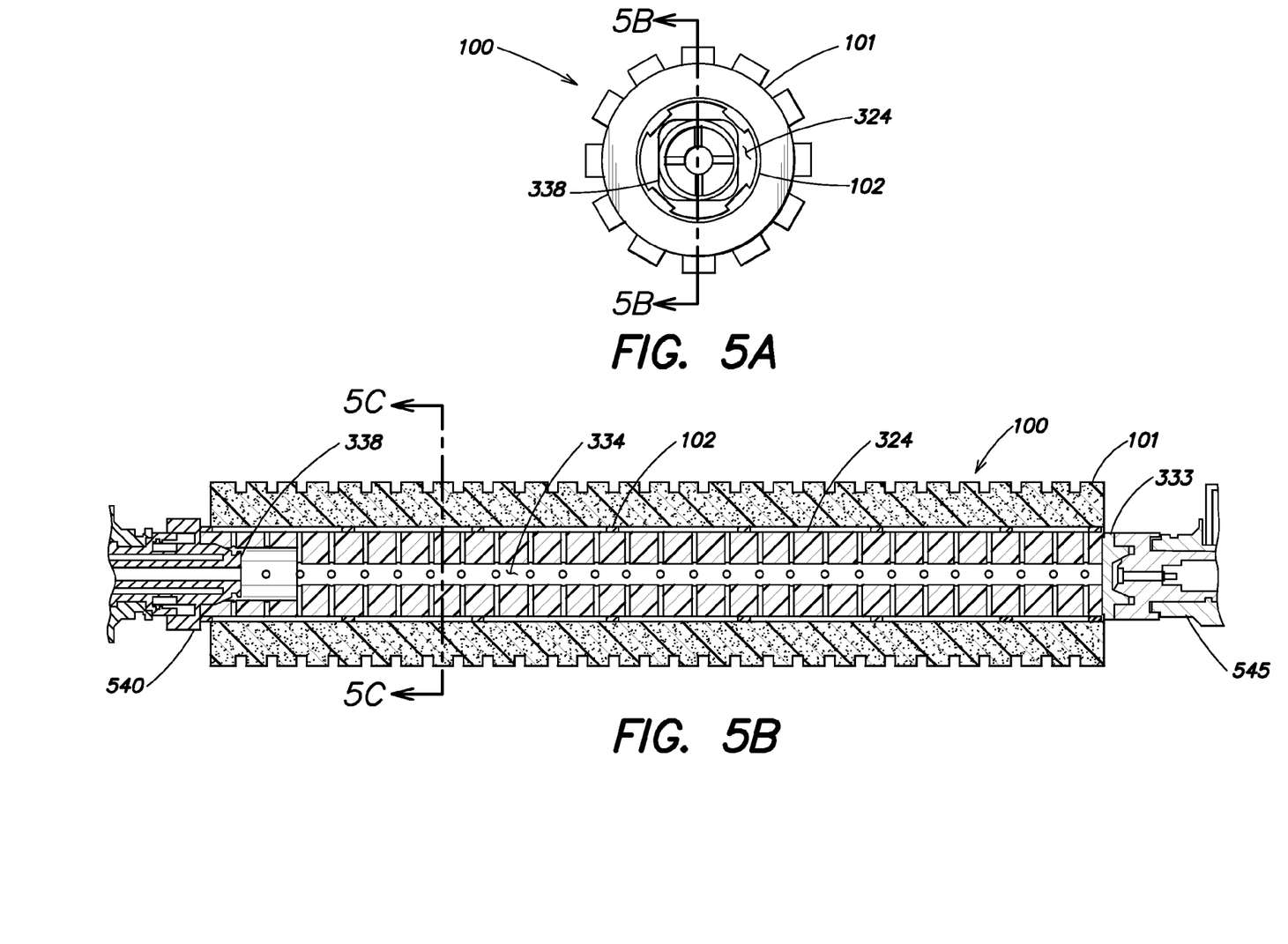
FIG. 5A illustrates an end plan view of a scrubber brush assembly according to embodiments.
FIG. 5B illustrates a cross-sectioned side view of a scrubber brush assembly taken along section line 5B-5B of FIG. 5A according to embodiments.

In more detail, the mandrel 24 may be coupled to a coupling 540 on one end and to a support member 545 on the other end. As shown in FIG. 5B, the support coupling 545 interfaces with the spacer 333 and supports the right end of the scrubber brush assembly 100, as shown, while allowing rotation thereof. On the left end as shown, the coupling 540 engages the coupling-receiving feature 338 and seals against a sealing surface (e.g., a cylindrical surface) of the coupling-receiving feature 338 to allow liquid to pass into the central liquid passage 334. The coupling 540 may also include a drive feature such as a squared end that is received in a like-shaped squared surface feature of the coupling-receiving feature 338 (FIG. 5A) so that the scrubber brush may be rotated by a drive member (not shown) attached to the coupling 540.

To prevent the scrubber brush 100 from sliding along a length of the mandrel 324 in use, stops may be formed on the coupling 540 and the spacer 333 (e.g., planar annular lips) that contact an end of the sleeve 102 when the scrubber brush assembly 100 is installed between the coupling 540 and the support member 545. Rotation of the coupling 540 therefore rotates the scrubber brush assembly 100. Bearings and bearing supports (not shown) may stabilize the entire assembly of the coupling 540, support member 545, and the scrubber brush assembly 100. Liquid chemicals may be provided through the coupling 540, into the central liquid passage 324 where it passes through the numerous liquid feed ports 336 and into the scrubber brush 101.

Figure 5C:
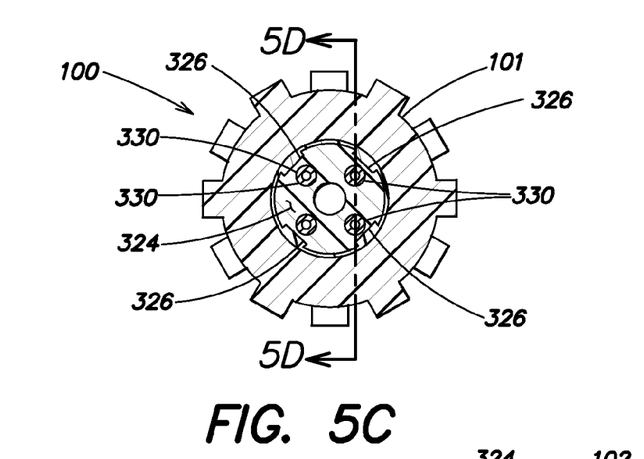
FIG. 5C illustrates a cross-sectioned end view of a scrubber brush assembly taken along section line 5C-5C of FIG. 5B according to embodiments.
Figure 5D:
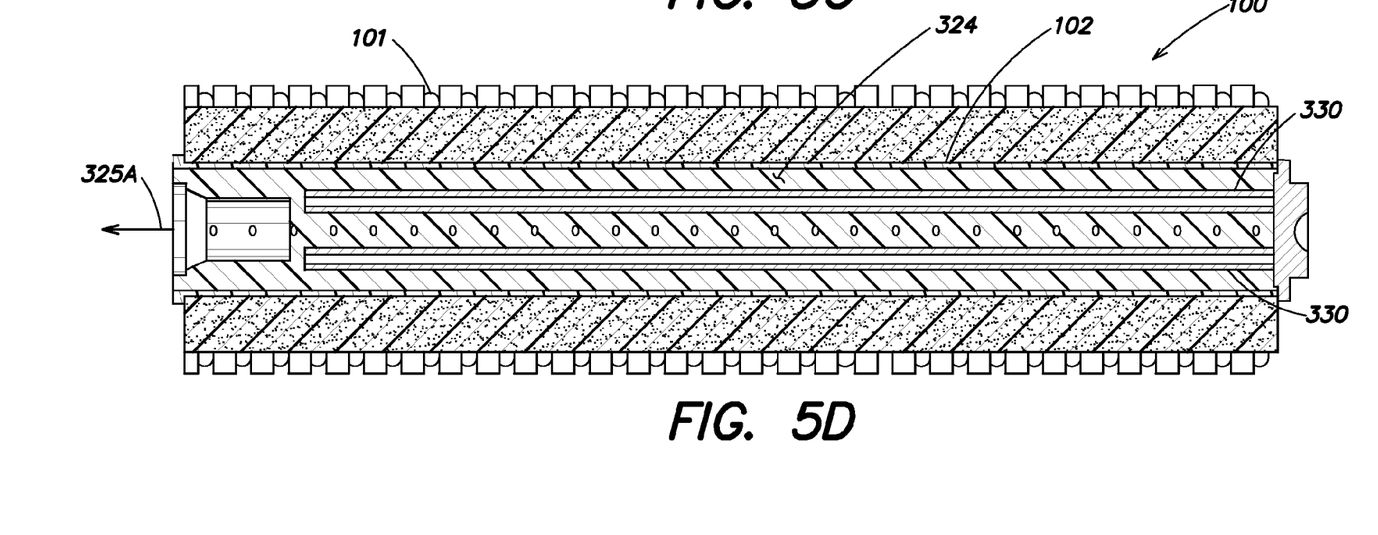
FIG. 5D illustrates a cross-sectioned side view of a scrubber brush assembly along section line 5D-5D of FIG. 5C according to embodiments.

FIGS. 5C and 5D illustrate various other cross sections of the scrubber brush assembly 100. Clearly shown are the one or more stiffening members 330 and the relative orientation thereof. In particular, as shown, the stiffening members 330 are substantially radially aligned with the recesses 326 in the mandrel 324. As shown, the stiffening members 330 are disposed in a circular pattern equidistant from a central axis 325 and at approximately 90 degrees from one another.

Figure 6A:
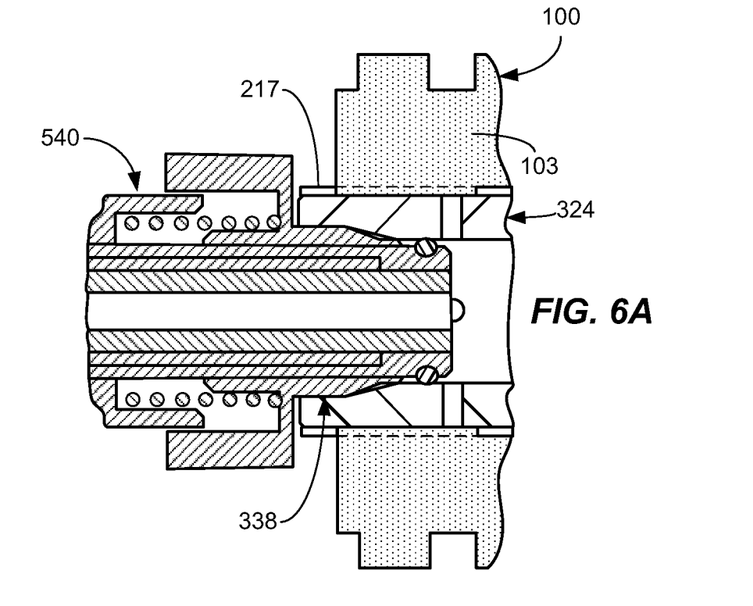
FIG. 6A illustrates a partial cross-sectioned side view of an end of a scrubber brush assembly coupled to a drive coupling according to embodiments.
Figure 6B:
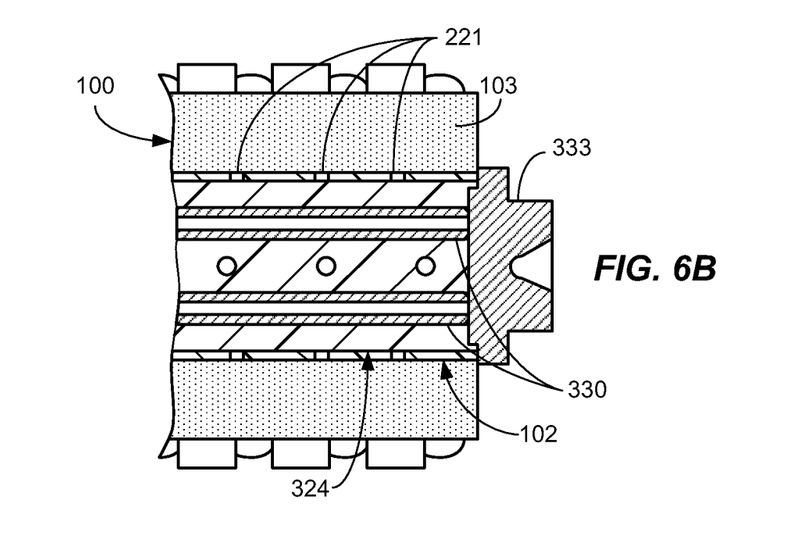
FIG. 6B illustrates a partial cross-sectioned side view of an end of a scrubber brush assembly coupled to a spacer according to embodiments.

FIGS. 6A and 6B illustrate the connections of the scrubber brush assembly 100 to the coupling 540 and spacer 333. In particular, the coupling 540 may be a spring loaded coupling received in the coupling-receiving feature 338. The coupling 540 may both seal against the feature 338 and lock into the feature 338 (e.g., lock into the squared surface to prevent rotation between the coupling 540 and the mandrel 324) such that a liquid may be transferred and the scrubber brush assembly 100 may be rotated thereby.

Figure 7:
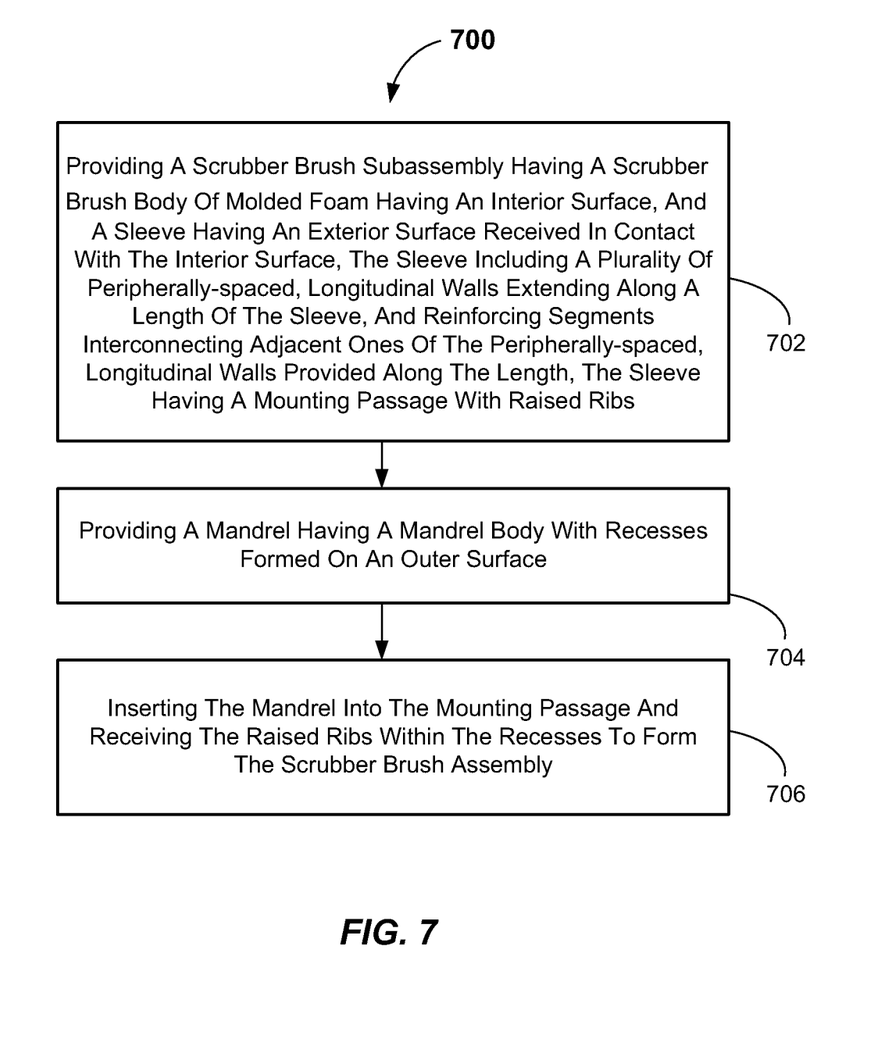
FIG. 7 illustrates a flowchart of a method of assembling a scrubber brush assembly according to embodiments.

FIG. 7 illustrates a method for assembling a scrubber brush assembly (e.g., 100). The method 700 includes, in 702, providing a scrubber brush subassembly (e.g., 100SA) having a scrubber brush body (e.g., 103) of molded foam having an interior surface (e.g., 108), and a sleeve (e.g., 102) having an exterior surface (e.g., 214) received in contact with the interior surface (e.g., 108), the sleeve (e.g., 102) including a plurality of peripherally-spaced, longitudinal walls (e.g., 216) extending along a length of the sleeve (e.g., 102), and reinforcing segments (e.g., 218) interconnecting adjacent ones of the peripherally-spaced, longitudinal walls (e.g., 216) provided along the length, the sleeve (e.g., 102) having a mounting passage (e.g., 110) with raised ribs (e.g., 112). The method 700 also includes, in 704, providing a mandrel (e.g., 324) having a mandrel body (e.g., 325) with recesses (e.g., 326) formed on an outer surface (e.g., 328), and, in 706, inserting the mandrel (e.g., 324) into the mounting passage (e.g., 110) and receiving the raised ribs (e.g., 112) within the recesses (e.g., 326).

Accordingly, while the present invention has been disclosed in connection with exemplary embodiments thereof, it should be understood that other embodiments may fall within the scope of the invention, as defined by the following claims.

The invention claimed is:

1. A scrubber brush assembly, comprising:
   a scrubber brush having a scrubber brush body including an interior surface;
   a sleeve having an exterior surface received in contact with the interior surface, the sleeve including peripherally-spaced, longitudinal walls extending along a length of the sleeve, and reinforcing segments provided along the length of the sleeve interconnecting adjacent ones of the peripherally-spaced, longitudinal walls and forming elongated pockets, the longitudinal walls comprising friction-enhancing apertures formed therein, the sleeve having raised ribs extending along the length; and
   a mandrel having recesses formed on an outer surface of the mandrel, the mandrel being coupled to the raised ribs by receiving the raised ribs within the recesses.

2. The scrubber brush assembly of claim 1, wherein the raised ribs are formed along an inner surface of the peripherally-spaced, longitudinal walls.

3. The scrubber brush assembly of claim 1, wherein the friction-enhancing apertures are arranged in a row in the peripherally-spaced, longitudinal walls.

4. The scrubber brush assembly of claim 1, wherein the reinforcing segments comprise hoop structures.

5. The scrubber brush assembly of claim 1, comprising at least three of the elongated pockets formed by the reinforcing segments along the length between adjacent ones of the peripherally-spaced, longitudinal walls.

6. The scrubber brush assembly of claim 5, wherein liquid feed ports on the mandrel are oriented to exit into the elongated pockets.

7. The scrubber brush assembly of claim 1, wherein the scrubber brush body comprises an open-cell foam.

8. The scrubber brush assembly of claim 1, wherein the mandrel comprises at least one stiffening member offset from a central axis of the mandrel.

9. The scrubber brush assembly of claim 8, wherein the mandrel comprises a plurality of stiffening members offset from, and arranged around, a central axis.

10. The scrubber brush assembly of claim 8, wherein the at least one stiffening member comprises a circular rod extending along a length of the mandrel.

11. The scrubber brush assembly of claim 8, wherein the mandrel comprises a plurality of stiffening members that are circular rods offset from, and arranged around a central axis.

12. A scrubber brush subassembly, comprising:
    a scrubber brush body of molded open-cell foam having an interior surface; and
    a sleeve having an exterior surface received in contact with the interior surface, the sleeve including a plurality of peripherally-spaced, longitudinal walls extending along a length of the sleeve, and reinforcing segments provided along the length and interconnecting adjacent ones of the peripherally-spaced, longitudinal walls to form elongated pockets, the longitudinal walls comprising friction-enhancing apertures formed therein, the sleeve including a mounting passage having raised ribs extending along the length.

\* \* \* \* \*